(12) United States Patent
Shi et al.

(10) Patent No.: US 12,222,389 B2
(45) Date of Patent: Feb. 11, 2025

(54) TEST BOARD FOR TESTING MEMORY SIGNAL

(71) Applicant: CHANGXIN MEMORY TECHNOLOGIES, INC., Hefei (CN)

(72) Inventors: Honglong Shi, Hefei (CN); Maosong Ma, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 334 days.

(21) Appl. No.: 17/662,368

(22) Filed: May 6, 2022

(65) Prior Publication Data
US 2023/0095908 A1 Mar. 30, 2023

(30) Foreign Application Priority Data
Sep. 27, 2021 (CN) .......................... 202111134623.4

(51) Int. Cl.
*G01R 31/317* (2006.01)
(52) U.S. Cl.
CPC .............................. *G01R 31/31713* (2013.01)
(58) Field of Classification Search
None
See application file for complete search history.

(56) References Cited

U.S. PATENT DOCUMENTS 7,424,659 B2 * 9/2008 Avraham ............... G11C 29/48
714/742

FOREIGN PATENT DOCUMENTS

CN 109240873 A 1/2019

\* cited by examiner

*Primary Examiner* — Jermele M Hollington
(74) *Attorney, Agent, or Firm* — Syncoda LLC; Feng Ma

(57) ABSTRACT

A test board for testing a memory signal includes a first surface and a second surface. The first surface of the test board comprises a raised region and a non-raised region. The raised region is provided with a first connection area connectable to a main board, and a level at which the raised is located is higher than a level at which the non raised region is located by a preset value. The second surface of the test board includes a test area and a second connection area connectable to a memory chip. The test board is provided with a first connection harness for connecting the test area to the first connection area and a second connection harness for connecting the test area to the second connection area, to enable the memory signal of the memory chip to be tested based on the test area.

12 Claims, 4 Drawing Sheets

TEST BOARD FOR TESTING MEMORY SIGNAL

CROSS-REFERENCE TO RELATED APPLICATION

This application claims priority to Chinese Patent Application No. 202111134623.4 filed on Sep. 27, 2021, the disclosure of which is hereby incorporated by reference in its entirety.

BACKGROUND

An area of a first surface and an area of a second surface on a test board for testing a memory signal are the same. In order to avoid physical interference with peripheral devices in a region of a main board corresponding to a mounting position of a memory chip, the sizes of the first surface and the second surface of the test board are limited by the size of the region of region of the main board corresponding to the mounting position of the memory chip. Additionally, since a signal of a pin on the memory chip is led out by a corresponding via provided on a sidewall of the test board, the circuit board needs a resistor-capacitor (RC) matching circuit when using a lead, to reduce the interference of the test lead to the original signal, which results in a complicated structure of the circuit board.

SUMMARY

The disclosure relates to a technical field of semiconductor memory, and further relates to, but is not limited to, a test board for testing a memory signal.

In view of the above, an embodiment of the present disclosure provides a test board for testing a memory signal, comprising a first surface and a second surface.

The first surface of the test board includes a raised region and a non-raised region; the raised region is provided with a first connection area connectable to a main board, and a level at which the raised region is located is higher than a level at which the non-raised region is located by a preset value.

The second surface of the test board includes a test area and a second connection area connectable to a memory chip.

The test board is provided with a first connection harness for connecting the test area to the first connection area and a second connection harness for connecting the test area to the second connection area, to enable the memory signal of the memory chip to be tested based on the test area.

BRIEF DESCRIPTION OF THE DRAWINGS

In the drawings, which are not necessarily drawn to scale, similar reference numerals may describe similar components in different views. Similar reference numerals with different letter suffixes may indicate different examples of similar components. The drawings generally illustrate, by way of example and not limitation, the various embodiments discussed herein.

DETAILED DESCRIPTION

In order to make the objectives, technical solutions and advantages of the embodiments of the present disclosure clearer, the specific technical solutions of the present disclosure will be described in further detail below with reference to the drawings in the embodiments of the present disclosure. The following embodiments are used to illustrate the present disclosure, but are not intended to limit the scope of the present disclosure.

In the subsequent descriptions, terms such as "module" or "unit" used to denote elements are used only for the benefit of the description of the present disclosure and have no specific meaning per se. Therefore, "module" or "unit" can be used interchangably.

In some implementations, during operation of the SDRAM chip, signals at an input port/output port needs to be tested to verify signal integrity.

When the SDRAM chip is soldered and operated in the system, the pins of the chip are usually hidden under the chip, and the probe of the test device cannot directly detect the pins. A specific insertion device needs to be provided to measure the signals at the pins of the chip without affecting the signal quality and the operation of the chip.

Many other components, such as resistors and capacitors, are usually disposed to surround the SDRAM chip. The insertion device is required to be designed to avoid physical interference with the devices surrounding the SDRAM chip.

In addition, the SDRAM chip ports operate at a very high speed (LPDDR4× 4266 Mbps), and the insertion device is required not to affect the functionality and performance of the SDRAM ports.

In some implementations, the test inserters are signal test inserters that can measure signal integrity as well as a control command and address (CA) signal. Since a signal at a pin of the memory chip is led out by a corresponding via provided on a sidewall of the test board, the circuit board needs RC matching when using a lead, to reduce the interference of the test lead to the current signal, and the maximum rate at which the command/address signal can be captured is 3200 Mbps (millions of bits per second).

Figure 1:
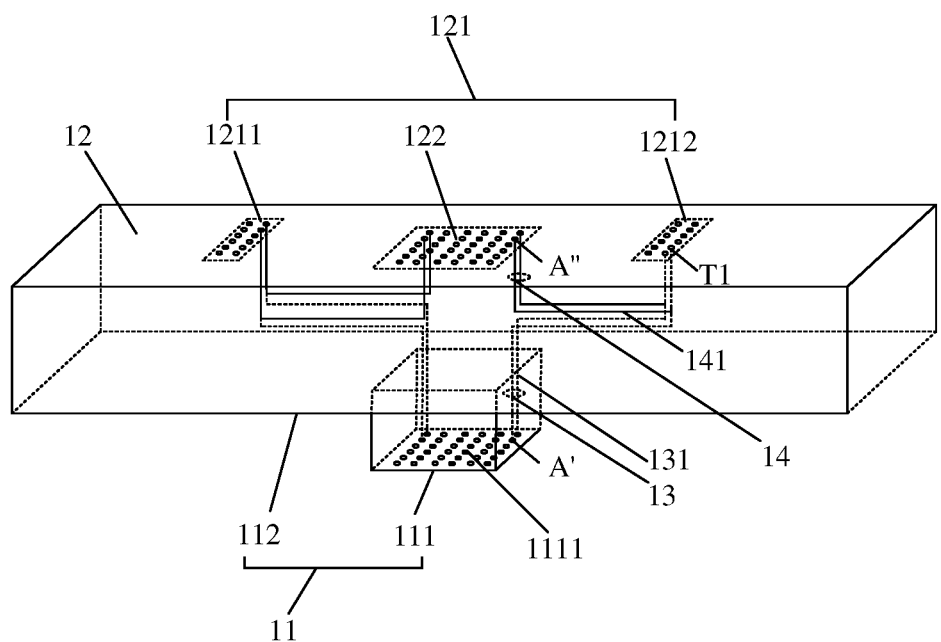
FIG. 1 is a schematic structural diagram of a test board for testing a memory signal according to an embodiment of the present disclosure.

Based on the above technical problems, an embodiment of the present disclosure provides a test board for testing a memory signal. The test board may be applied to a scene of performing signal testing for each function pin on a memory chip. As shown in FIG. 1, the test board includes a first surface 11 and a second surface 12.

The first surface 11 of the test board includes a raised region 111 and a non-raised region 112. The raised region 111 is provided with a first connection area 1111 connectable to a main board, and a level at which the raised region 111 is located is higher than a level at which the non-raised region 112 is located by a preset value.

The second surface 12 of the test board includes a test area 121 and a second connection area 122 connectable to a memory chip.

The test board is provided with a first connection harness 13 for connecting the test area 121 to the first connection area 1111 and a second connection harness 14 for connecting the test area 121 to the second connection area 122, to enable the memory signal of the memory chip to be tested based on the test area 121.

In some embodiments, the test board may be a printed circuit board (PCB), the first surface of the test board may be an upper surface of the PCB, and the second surface of the test board may be a lower surface of the PCB.

For implementation of the raised region 111 in the first surface of the test board, for example, the test board may be designed to have a bottom with a raised region by a PCB manufacturing blind fishing process.

In some embodiments, the preset value may be 2.5 mm (millimeters), i.e., the level at which the raised region 111 is located may be higher than the level at which the non-raised region 112 is located by 2.5 mm.

Since the height of devices on the main board is generally less than 2.5 mm, physical interference with peripheral devices of the memory chip can be avoided when the level at which the raised region 111 is located is higher than the level at which the non-raised region 112 is located by 2.5 mm.

In some exemplary embodiments, the raised region 111 and the first connection area 1111 may be the same. The second connection area 122 and the first connection area 1111 may correspond to the memory chip respectively, and the second connection area 122 and the first connection area 1111 may have the same area. The connection points provided on the second connection area 122 and the connection points provided on the first connection area 1111 may correspond to positions of the pins of the memory chip. For example, for the pin A, pin B, and pin C of the memory chip, a connection point A1, a connection point B1, and a connection point C1 are provided at the positions on the second connection area 122 corresponding to the connection point A1, the connection point B1, and the connection point C1, respectively. And a connection point A2, a connection point B2, and a connection point C2 are provided at the positions on the first connection area 1111 corresponding to the connection point A2, the connection point B2, and the connection point C2, respectively. It will be understood that the connection line between the connection points A1 and A2, the connection line between the connection points B1 and B2, and the connection line between the connection points C1 and C2 may be parallel to the side surfaces of the test board, i.e., perpendicular to the first surface 11 or the second surface 12 of the test board.

In some embodiments, in the case that the test points for testing all the function pins of the memory chip are included on the test area 121, since each of connection lines in the first connection harness 13 or in the second connection harness 14 is connected to a different test point on the test area 121, each of the connection lines in the first connection harness 13 and each of the connection lines in the second connection harness 14 is isolated from each other.

In some embodiments, the test board may be provided with the first connection harness 13 for connecting the test area 121 to the first connection area 1111 and the second connection harness 14 for connecting the test area 121 to the second connection area 122, to enable the memory signal of the memory chip to be tested based on the test area 121. The first connection harness 13 and the second connection harness 14 may be provided in the test board. Each of the first connection lines in the first connection harness 13 may connect a respective one of the test points on the test area 121, and each of the second connection lines in the second connection harnesses 14 may connect a respective one of the test points on the test area 121.

It will be understood that since the test points on the test area 121 correspond to the function pins on the memory chip one to one, each of the test points corresponds to two connection lines, one of which is connected to a connection points on the first connection area 1111 corresponding to a respective function pin, and the other one of which is connected to a connection point on the second connection area 122 corresponding to the respective function pin. For example, for the function pin A of the memory chip, a test point T1 corresponding to the function pin A is provided on the test area 121, a connection point A' corresponding to the function pin A is provided on the first connection area 1111, and a connection point A" corresponding to the function pin A is provided on the second connection area 122. Thus, the connection point A' and the test point T1 are connected through a first connection line 131 in the first connection harness 13, and the connection point A" and the test point T1 are connected through a second connection line 141 in the second connection harness 14.

In some embodiments, the connection point may be a connection pad. The test point may be a test pad or a test socket.

In an embodiment of the present disclosure, since the first surface of the test board includes the non-raised region and the raised region, the raised region is provided with the first connection area connectable to the main board, and the level at which the raised region is located is higher than the level at which the non-raised region is located by the preset value. Therefore, the test board can avoid the problem of physical interference with the peripheral devices on the main board where the memory is mounted, and the area of the second surface may not be limited by the size of the mounting position of the memory chip on the main board. Further, since the test board is provided with the first connection harness for connecting the test area to the first connection area and the second connection harness for connecting the test area to the second connection area, the memory signal of the memory chip can be tested based on the test area, no leads are outside of the test board, and the interference can be relatively small. Therefore, it is unnecessary to add a resistor-capacitor RC matching circuit into the circuit board, and the structure is relatively simple.

In some embodiments, the test area 121 may include at least two sub-test areas surrounding the second connection area 122. The at least two sub-test areas may have a same number of test points.

Here, since the test area 121 is disposed to surround the second connection area 122, in the case that the second connection area 122 is a square area, the test area 121 may be disposed on any one of the four sides of the square area as long as one side meet the limitations for positions of the test points in the test area. Of course, the test area 121 may include four sub-test areas disposed to surround the four sides of the square area respectively, based on limitations of the number of test points and the position as well as the size of the test area.

It will be appreciated that each of the function pins in the memory chip may be provided with a respective test point on the test area 121. In the case that the number of function pins of the memory chip is an even number and the test area 121 includes two sub-test areas, each of the sub-test areas may have the same number of test points.

Of course, in the case that the number of function pins of the memory chip is an odd number, the test area 121 may include three sub-test areas with the same number of test points.

In some embodiments, in the case that the number of function pins of the memory chip is an even number and the test area 121 includes two sub-test areas, each of the sub-test areas may also have the same number of test points, but one of the test points is not utilized and is in an idle state.

It can be seen that at least two sub-test areas with the same number of test points are disposed to surround the second connection area, which is not only convenient for testing the signal, but also in better shape.

In some embodiments, the second connection area 122 is a square area, the at least two sub-test areas include a first sub-test area 1211 and a second sub-test area 1212, and the first sub-test area 1211 and the second sub-test area 1212 are respectively disposed along two long sides of the second connection area 122.

It will be appreciated that the first sub-test area 1211 and the second sub-test area 1212 are respectively disposed along two long sides of the second connection area 122, which is convenient for testing the signal, and in better shape.

In some embodiments, the test area 121 may be provided with test points. the number of the test points on the test area are the same as the number of function pins of the memory chip. The main board may include a third connection area connectable to the first connection area 1111, the third connection area may be provided with first connection points connectable to the function pins of the memory chip, and the first connection area 1111 may be provided with second connection points at positions for connecting the first connection points.

Each of the first connection lines 131 in the first connection harness 13 may be bridged between a respective one of the second connection points and a respective one of the test points corresponding to the respective second connection point.

It will be appreciated that the test board is disposed between the main board and the memory chip, and each function pin of the memory chip needs to be connected to the main board at a position corresponding to the respective function pin through the test board. Thus, the third connection area connectable to the first connection area 1111 of the test board is provided on the main board. The first connection area 1111 of the test board is provided with second connection points, and each of the second connection points correspond to a respective one of the first connection points on the third connection area connectable to a respective one of the function pins of the memory chip. For example, the connection point A'' in the first connection points and the connection point A'' in the second connection points correspond to the function pin A of the memory chip; that is, the function pin A of the memory chip is connected to the connection point A''' and the connection point A', such that the connection point A' corresponding to the function pin A on the test board is connected to the main board. Here, since the connection point A'' is the connection point on the third connection area on the main board, it is not shown in FIG. 1.

In some embodiments, each of the first connection lines 131 in the first connection harness 13 may be bridged between a respective one of the second connection points and a respective one of the test points corresponding to the respective second connection point. For the function pin A on the memory chip, the first connection line 131 in the first connection harness 13 may connect the connection point A' in the second connection points and the test point T1 corresponding to the connection point A', such that the connection point A' in the second connection points corresponding to the function pin A may be connected to the test point T1 corresponding to the connection point A' through the first connection line 131.

It can be seen that each of the first connection lines in the first connection harness is bridged between the respective one of the second connection points and the respective one of the test points corresponding to the respective second connection point. And since each of the second connection points on the test board is connected to a respective one of the first connection points on the main board corresponding to the respective second connection point, the signals at the second connection points on the test board can be led to the test points.

In some embodiments, the second connection area 122 may be provided with third connection points at positions for connecting the pins of the memory chip.

Each of the second connection lines 141 in the second connection harnesses 14 may be bridged between a respective one of the third connection points and a respective one of the test points corresponding to the respective third connection point.

It will be appreciated that, in order to connect the test board to the memory chip, the third connection points connectable to the pins of the memory chip are provided on the second connection area 122 of the test board.

In some embodiments, each of the second connection lines 141 in the second connection harness 14 may be bridged between a respective one of the third connection points and a respective one of the test points corresponding to the respective third connection point. For the function pin A of the memory chip, the second connection line 141 in the second connection harness 14 may connect the connection point A'' in the third connection points to the test point T1 corresponding to the connection point A'', such that the connection point A'' in the third connection points corresponding to the function pin A may be connected to the test point T1 corresponding to the connection point A'' through the second connection line 141.

In the embodiment of the present disclosure, each of the first connection lines of the first connection harness may be bridged between a respective one of the second connection points and a respective one of the test points corresponding to the respective second connection point; and each of the second connection lines of the second connection harness may be bridged between a respective one of the third connection points and a respective one of the test points corresponding to the respective third connection point. Therefore, through the first connection line and the second connection line, the function pins of the memory chip can be connected to the test points correspondingly; and at the same time, the signals on the function pins of the memory chip can be led to the test points corresponding to the function pins, to facilitate the signal testing.

In some embodiments, two adjacent first connection lines 131 in the first connection harness 13 may be insulated from each other. Two adjacent second connection lines 141 in the second connection harness 14 may be insulated from each other. The first connection lines 131 may have a segment parallel to a segment of the second connection lines 141. The segment of the first connection lines 131 may be equal in length to the segment of the second connection lines 141.

Figure 2A:
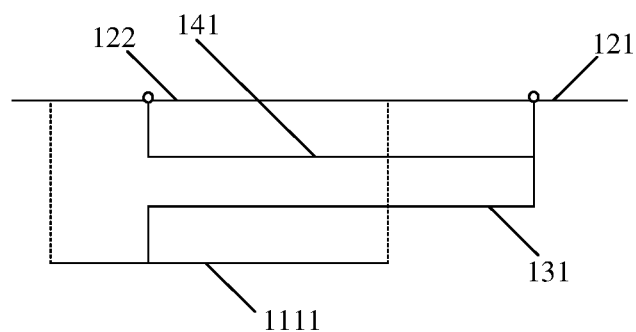
FIG. 2A is a schematic structural diagram of a first connection line and a second connection line according to an embodiment of the present disclosure.
Figure 2B:
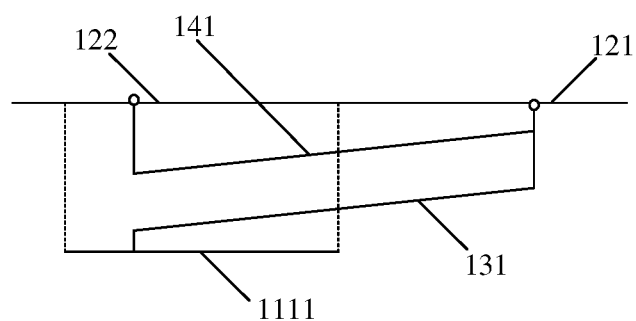
FIG. 2B is another schematic structural diagram of a first connection line and a second connection line according to an embodiment of the present disclosure.

It will be understood that the first connection lines 131 and the second connection lines 141 may be the leads as shown in FIG. 2A or the leads as shown in FIG. 2B.

In some embodiments, as shown in FIG. 2A, a distance between the segment of the first connection lines 131 and the segment of the second connection lines 141 may be greater than or equal to a first distance threshold.

Here, the first distance threshold may be a safety spacing. For example, the first distance threshold may be a minimum distance that ensures insulation of the first connection lines 131 and the second connection lines 141.

It will be understood that since the first connection lines 131 have a segment parallel to a segment of the second connection lines 141, the segment of the first connection lines 131 is equal in length to the segment of the second connection lines 141, and the distance between the segment of the first connection lines 131 and the segment of the second connection lines 141 is greater than or equal to the first distance threshold value, the power loss of the signal transmission is smaller, and there is no need to additionally add a RC matching resistor in the circuit.

In some embodiments, the memory chip may include function pins with different functions. The first connection lines 131 may include first sub-connection lines corresponding to different functions; and the second connection lines 141 may include second sub-connection lines corresponding to different functions.

For each of the functions, a first sub-connection line corresponding to the function may be bridged between a respective one of the second connection points corresponding to the function and a respective one of the test points corresponding to the function.

For each of the functions, a second sub-connection line corresponding to the function may be bridged between a respective one of the third connection points corresponding to the function and a respective one of the test points corresponding to the function, to enable a corresponding function signal of the memory chip to be tested based on a test point corresponding to the function.

In the embodiment of the present disclosure, according to the function pins with different functions on the memory chip, the first connection lines may be divided into the first sub-connection lines corresponding to different functions, and the second connection lines may be divided into the second sub-connection lines corresponding to different functions. A first sub-connection line corresponding to a respective function may be bridged between a second connection point corresponding to the function and a test point corresponding to the function. A second sub-connection line corresponding to a function may be bridged between a third connection point corresponding to the function and a test point corresponding to the function. Therefore, a function signal of the memory chip corresponding to the function can be tested based on a test point corresponding to the function.

In some embodiments, the memory chip may be a synchronous dynamic random access memory (SDRAM) chip. The memory chip may include a data signal (DQ) pin. The second connection points may include a first DQ connection point. The third connection point may include a second DQ connection point. The test point may include a DQ test point;

Correspondingly, the first connection lines 131 may include a first DQ connection line; and the second connection lines 141 may include a second DQ connection line.

The first DQ connection line may be bridged between the first DQ connection point and the DQ test point corresponding to the first DQ connection point.

The second DQ connection line may be bridged between the second DQ connection point and the DQ test point corresponding to the second DQ connection point, to enable the first DQ connection point to be connected to the second DQ connection point corresponding to the first DQ connection point, and to enable a DQ signal of the memory chip to be tested based on the DQ test point.

It will be appreciated that the SDRAM chip may include a high speed signal pin (DQ pin). Correspondingly, the test points may include a DQ test point, and the second connection points may include a first DQ connection point; the third connection points may include a second DQ connection point; the first connection lines 131 may include a first DQ connection line; and the second connection line 141 may include a second DQ connection line.

In the embodiment of the present disclosure, the first DQ connection line may be bridged between the first DQ connection point and the DQ test point corresponding to the first DQ connection point. The second DQ connection line may be bridged between the second DQ connection point and the DQ test point corresponding to the second DQ connection point, to enable the first DQ connection point to be connected to the second DQ connection point corresponding to the first DQ connection point. That is, the DQ pin of the memory chip can lead the DQ signal to the DQ test point while being connected to the connection point on the main board corresponding to the DQ pin, so that the DQ signal of the memory chip can be tested based on the DQ test point.

In some embodiments, the memory chip may further include a control command and address signal (CA) pin. The second connection points may further include a first CA connection point; the third connection points may further include a second CA connection point; and the test points may further include a CA test point. Correspondingly, the first connection lines 131 may further include a first CA connection line; and the second connection lines 141 may further include a second CA connection line.

The first CA connection line may be bridged between the first CA connection point and a CA test point corresponding to the first CA connection point.

The second CA connection line may be bridged between the second CA connection point and the CA test point corresponding to the second CA connection point, to enable a CA signal of the memory chip to be tested based on the CA test point.

It will be appreciated that the SDRAM chip may include a control command and address signal (CA) pin. Correspondingly, the test points may include a CA test point, the second connection points may include a first CA connection point; and the third connection points may include a second CA connection point. The first connection lines 131 may include a first CA connection line; and the second connection lines 141 may include a second CA connection line.

In the embodiment of the present disclosure, the first CA connection line may be bridged between the first CA connection point and a CA test point corresponding to the first CA connection point. The second CA connection line may be bridged between the second CA connection point and the CA test point corresponding to the second CA connection point, to enable a CA signal of the memory chip to be tested based on the CA test point. That is, the CA pin of the memory chip can lead the CA signal to the CA test point while being connected to the connection point on the main board corresponding to the CA pin, so that the CA signal of the memory chip can be tested based on the CA test point.

In some embodiments, the distance between the DQ test point and the second DQ connection point corresponding to the DQ test point may be less than a preset distance threshold.

For example, the preset distance threshold may be 5 mm.

In the embodiment of the present disclosure, since the distance between the DQ test point and a second DQ connection point corresponding to the DQ test point is less than 5 mm, so as to avoid excessive reflection due to stubs on the signal line, which would cause impracticability of high-speed (above Gbps) signal measurement.

Figure 3:
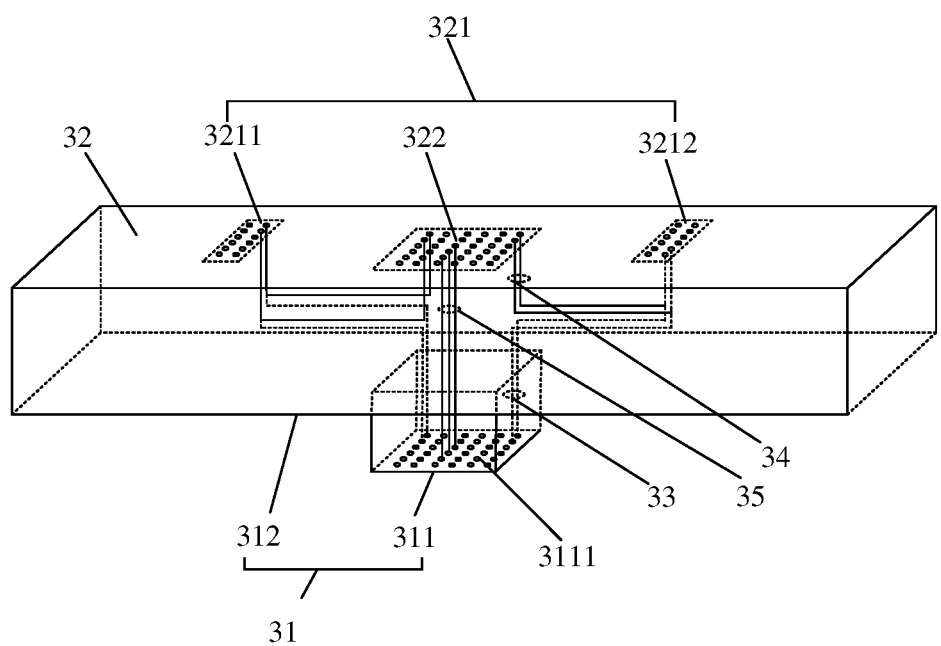
FIG. 3 is another schematic structural diagram of a test board for testing a memory signal according to an embodiment of the present disclosure.

FIG. 3 is another schematic structural diagram of a test board for testing a memory signal according to an embodiment of the present disclosure. The test board is applied to a scenario in which the number of test points on the test area is smaller than the number of function pins of the memory chip. That is, not all function pins of the memory chip are to be tested. As shown in FIG. 3, the test board includes a first surface 31 and a second surface 32.

The first surface 31 of the test board includes a raised region 311 and a non-raised region 312. The raised region 311 is provided with a first connection area 3111 connectable to a main board, and a level at which the raised region 311 is located is higher than a level at which the non-raised region 312 is located by a preset value.

The second surface 32 of the test board includes a test area 321 and a second connection area 322 connectable to a memory chip.

The test board is provided with a first connection harness 33 for connecting the test area 321 to the first connection area 3111, a second connection harness 34 for connecting the test area 321 to the second connection area 322, and a third connection harness 35 for connecting the first connection area 3111 to the second connection area 322, so that the memory signal of the memory chip can be tested based on the test area 321.

In the embodiment of the present disclosure, since the number of test points provided on the test area is smaller than the number of function pins of the memory chip, it is necessary to connect the pins of the memory chip that do not perform signal test to the pins on the main board corresponding to the pins of the memory chip through the test board. That is, the third connection harness for connecting the first connection area to the second connection area may be further provided in the test board so as to connect each of the function pins of the memory chip to the main board, and to enable signal test of the function pins connected to the test area.

In some embodiments, the test area 321 may include a test sub-area and the test sub-area is provided with test points for specific function pins of the memory chip.

The first connection area 3111 may include a first sub-area and a second sub-area other than the first sub-area, the first sub-area may be connectable to a mounting area of the specific function pins on the main board.

The second connection area 322 may include a third sub-area and a fourth sub-area other than the third sub-area, the third sub-area may be connectable to the specific function pins.

Both the first connection harness 33 and the second connection harness 34 may include a first sub-harness. The first sub-harness may be configured to connect the test sub-area to the first sub-area and the third sub-area.

The third connection harness 35 may include a second sub-harness and the fourth sub-area; the second sub-harness may be configured to connect the second sub-area to the fourth sub-area.

In some embodiments, test area 321 may include a test sub-area 3211 and a test sub-area 3212.

It will be understood that the test points for the specific function pins of the memory chip may denote function pins of the memory chip corresponding to the functions to be tested. For example, if functions to be tested include signal integrity (SI)/power integrity (PI) test, the function pins involved in the function to be tested of the memory chip may include at least a DQ pin and a CA pin. Then, the first sub-area may denote an area connectable to a mounting area of the DQ pin and the CA pin on the main board. The third sub-area may denote an area for connecting the DQ pin and the CA pin.

In some embodiments, both the first connection harness 33 and the second connection harness 34 may include a first sub-harness. The first sub-harness may be configured to connect the test sub-area to the first sub-area and the third sub-area respectively. The first sub-harness may be configured to connect the test sub-area of the DQ pin and the CA pin to the first sub-area at a position corresponding to a mounting area of the DQ pin and the CA pin on the main board. And the first sub-harness may be also configured to connect the test sub-area of the DQ pin and the CA pin to the area of the DQ pin and the CA pin in the third sub-area.

The third connection harness 35 may include a second sub-harness for connecting the second sub-area and the fourth sub-area.

In some embodiments, the third connection harness 35 may include a second sub-harness for connecting the second sub-area and the fourth sub-area. The second sub-harness may be configured to connect the test sub-area of function pins other than the DQ pin and the CA pin to the second sub-area at a position corresponding to the mounting area of the DQ pin and the CA pin on the main board. And the second sub-harness may be configured to connect the test sub-area of the DQ pin and the CA pin to the area of the DQ pin and the CA pin in the fourth sub-area.

In the embodiment of the present disclosure, the first sub-harness included in both the first connection harness and the second harness may be configured to connect the test point for the specific function pin in the test sub-area to the contact point corresponding to the specific function pin in the first sub-area and in the third sub-area respectively. And the second sub-harness included in both the first connection harness and the second harness may be configured to connect the contact point of the function pins other than the specific function pin in the first sub-area to the contact point of the function pins other than the specific function pin in the third sub-area, correspondingly. Therefore, each of the function pins of the memory chip is connected to the main board, while the test point for the specific function pin on the memory chip can be led out to the test point for the specific function pin on the main board, thereby enabling signal test of the function pins connected to the test area.

In some embodiments, connection line in the second sub-harness may be parallel to each other.

It will be appreciated that the second sub-harness may be used for the second sub-area and fourth sub-area. Since the positions of the connection points in the second sub-area correspond to the positions of the connection points in the fourth sub-area, the connection lines in the second sub-harness may be perpendicular to the first surface 31 and the second surface 32 of the first test board. That is, the connection lines in the second sub-harness may be parallel to each other.

It can be seen that the connection lines in the second sub-harness may be parallel to each other, so that not only the safe distance between each of the connection lines in the second sub-harness can be ensured, but also the process is simple.

In some embodiments, the memory chip may be an SDRAM chip. The test sub-area may include a DQ test sub-area. The DQ test sub-area may be provided with a test point for a DQ pin.

The first sub-area may include a first DQ sub-area. The first DQ sub-area may be connectable to a mounting area of the DQ pin on the main board.

The third sub-area may include a second DQ sub-area. The second DQ sub-area may be connectable to a DQ function pin.

The first sub-harness may include a DQ sub-harness, and the DQ sub-harness may be configured to connect the DQ test sub-area to the first DQ sub-area and the second DQ sub-area respectively.

In one possible implementation, the first DQ sub-area in the first sub-area may be connectable to the mounting area of the DQ pin on the main board. The second DQ sub-area may be connectable to the DQ function pin. And the DQ sub-harness may be configured to connect the DQ test sub-area to the first DQ sub-area and the second DQ sub-area. Therefore, the DQ function pin on the memory chip can be connected to the main board, while the test point for the DQ function pin on the memory chip can be led out to the test point for the DQ function pin on the main board, thereby enabling signal test of the DQ function pin connected to the test area.

In some embodiments, the test sub-area may further include a CA test sub-area. The CA test sub-area may be provided with a test point for a CA pin.

The first sub-area may further include a first CA sub-area, and the first CA sub-area may be connectable to the mounting area of the CA pin on the main board.

The third sub-area may further include a second CA sub-area, and the second CA sub-area may be connectable to a CA function pin.

The first sub-harness may further include a CA sub-harness, the CA sub-harness being configured to connect the CA test sub-area to the first CA sub-area and the second CA sub-area respectively.

In the embodiment, the first CA sub-area in the first sub-area may be connectable to the mounting area of the CA pin on the main board. The second CA sub-area may be connectable to the CA function pin. And the CA sub-harness may be configured to connect the CA test sub-area to the first CA sub-area and the second CA sub-area. Therefore, the CA function pin on the memory chip can be connected to the main board, while the test point for the CA function pin on the memory chip can be led out to the test point for the CA function pin on the main board, thereby enabling signal test of the CA function pin connected to the test area.

In some embodiments, the test area may include at least two sub-test areas, each of the at least two sub-test areas may be provided with an array of test points with an equal row spacing and an equal column spacing.

In the embodiment of the present disclosure, since each of the sub-test areas may be provided with an array of test points with an equal row spacing and an equal column spacing, it can not only ensure a safe spacing but also facilitate technical implementation.

In some embodiments, a distance between two adjacent test points may be greater than or equal to a second distance threshold.

It will be appreciated that the second distance threshold may be a distance threshold determined in consideration of the convenience of testing given that it is a safe spacing. The second distance threshold may be greater than or equal to the safe spacing between the test points.

In the embodiment of the present disclosure, the distance between two adjacent test points may be greater than or equal to the second distance threshold, which is beneficial to avoid signal insulation problems during the signal test.

Figure 4:
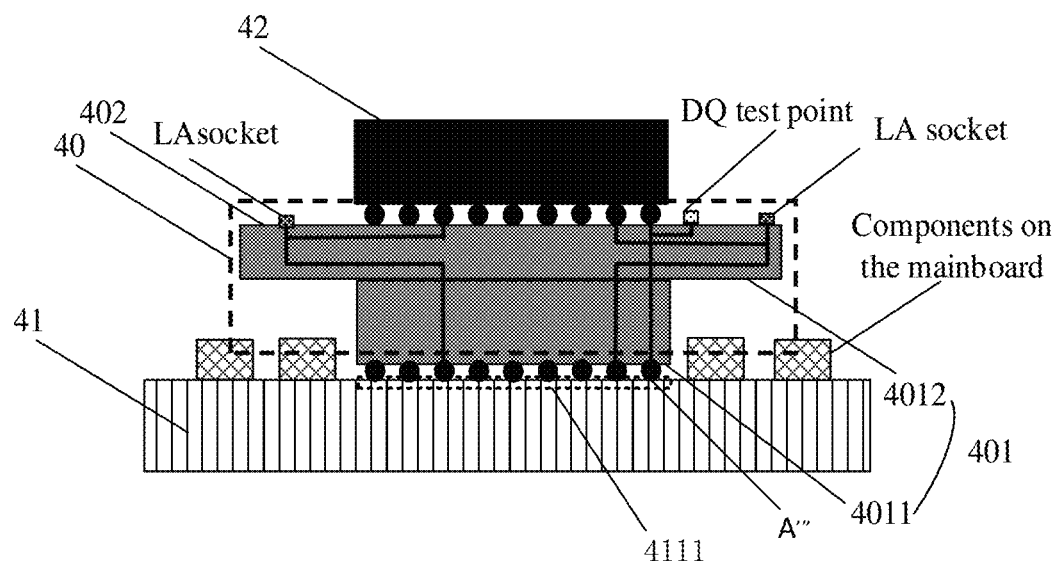
FIG. 4 is schematic diagrams of a structure of a synchronous dynamic random-access memory (SDRAM) signal measurement inserter according to an embodiment of the present disclosure.

FIG. 4 is schematic diagram of a structure of an SDRAM signal measurement inserter according to an embodiment of the present disclosure. As shown in FIG. 4, the SDRAM signal measurement inserter 40 is located between a PCB system board 41 and an SDRAM chip 42. A first surface 401 of the SDRAM signal measurement inserter 40 includes a raised region 4011 and a non-raised region 4012. The raised region 4011 is provided with a first connection area connectable to a PCB system board 41. And a level at which the raised region 4011 is located is higher than a level at which the non-raised region 4012 is located is by 2.5 mm. The second surface 402 of the SDRAM signal measurement inserter 40 includes a DQ test point and a CA test point (LA socket) suitable for measurement by a logic timing analyzer (LA). Meanwhile, the SDRAM signal measurement inserter 40 is further provided with a CA signal line and a DQ signal line. The CA signal line is first pulled from a pin at the bottom of the test board to the LA socket, and then pulled from the LA socket to a pin at the top of the test board without adding an additional RC matching resistor. The DQ signal line directly leads out a small trace with a length of less than 5 mm, so as to avoid excessive reflection due to residual stub(s) on the signal line, which would cause impracticability of high-speed (above Gbps) signal measurement.

Figure 5A:
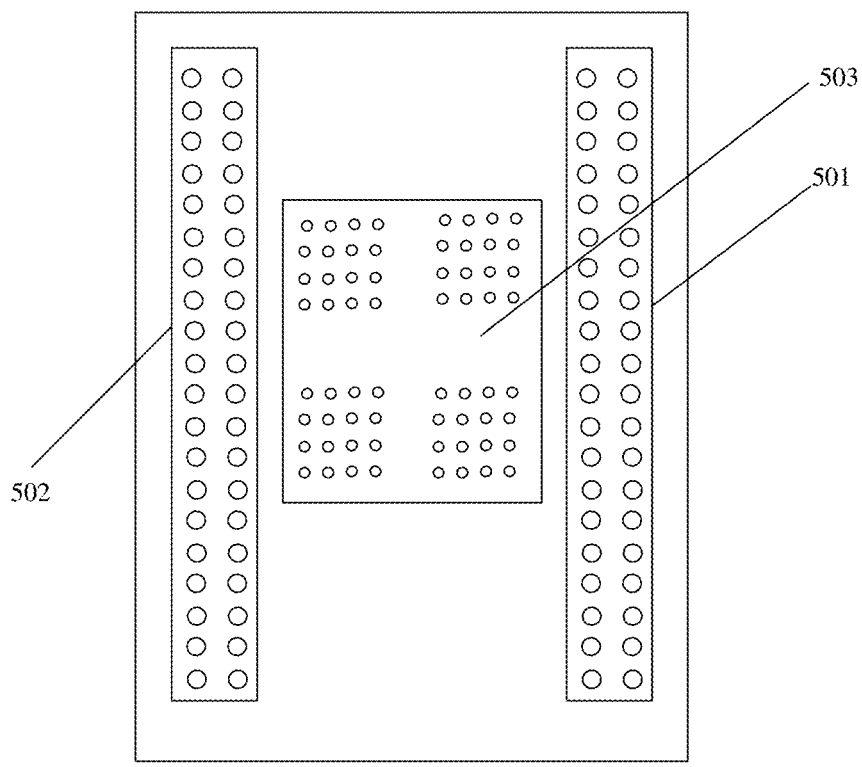
FIG. 5A is a top view of a SDRAM signal measurement inserter according to an embodiment of the present disclosure.

FIG. 5A is a top view of a SDRAM signal measurement inserter according to an embodiment of the present disclosure. As shown in FIG. 5A, the SDRAM signal measurement inserter includes a first test area 501, a second test area 502, and a connection area 503 connected to the SDRAM.

As can be seen, both the first test area 501 and the second test area 502 are provided with an array of test points with an equal row spacing and an equal column spacing, and are also provided with an array of test points with an equal row spacing and an equal column spacing.

Figure 5B:
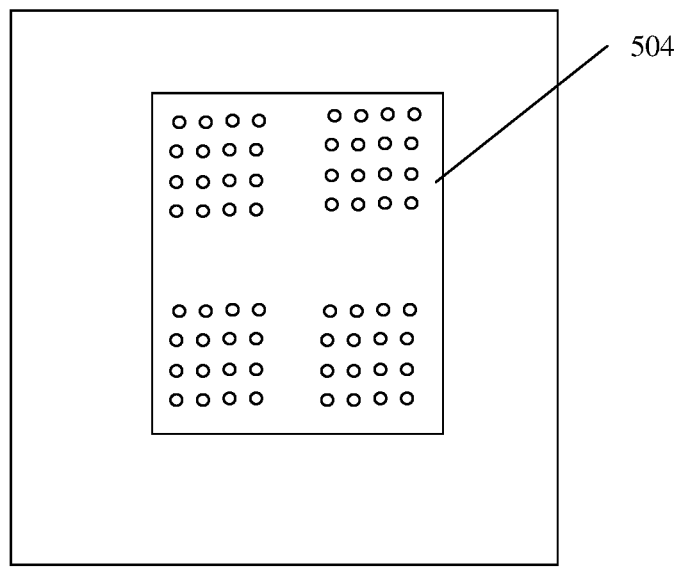
FIG. 5B is a bottom view of a SDRAM signal measurement inserter according to an embodiment of the present disclosure.

FIG. 5B is a bottom view of a SDRAM signal measurement inserter according to an embodiment of the present disclosure. As shown in FIG. 5B, the SDRAM signal measurement inserter has only a raised region 504 at a mounting position of the SDRAM corresponding to the raised region 504, and it can be seen that the raised region 504 and the SDRAM have almost the same area.

In some embodiments, t the signal test inserter may be operated as the following.

In step 601, when both the power supply of the signal test board and the main board are turned off, the signal test board and the main board are connected by soldering.

In step 602, the SDRAM chip to be tested is soldered to the signal test board.

In step 603, the system is powered on; after the chip is in a normal operating state, a signal measuring device such as an oscilloscope and a logic analyzer is used to measure a signal from the signal test board.

In step 604, if protocol analysis of the command and address (CA) signal is to be captured, the result is captured once with the logic analyzer; and if the signal integrity of the data signal line is to be tested, the step 603 is repeated to perform multiple measurements on all data signals to be measured.

It is to be understood that the DQ signal measurement may be performed on the first test pad by using an oscilloscope, when both the test board and the main board are in a normal operating state.

In some embodiments, in a case where both the test board and the main board are in the normal operating state, measurement of the DQ signal is performed on the first test pad for multiple times by using the oscilloscope, to obtain a plurality of signal measurements.

The integrity of the DQ signal may be determined based on the plurality of signal measurements.

In some embodiments, a CA signal measurement may be performed on the second test pad by using the logic analyzer (LA), when both the test board and the main board are in the normal operating state.

In some embodiments, the CA signal may be captured on the second test pad by using the LA, and the protocol verification may be performed based on the captured CA signal, when both the test board and the main board are in the normal operating state.

The test board for testing the memory signal according to the embodiment of the disclosure is similar to the test board for testing the memory signal according to the foregoing embodiments. For technical features not fully disclosed in the present embodiment, please refer to the foregoing embodiments for understanding, which will not be repeated here.

In the embodiment of the present disclosure, since the first surface of the test board includes the non-raised area and the raised area, the raised area is provided with the first connection area connectable to the main board, and the level at which the raised area is located is higher than the level at which the non-raised area is located by a preset value. Therefore, the test board can avoid the problem of physical interference with the peripheral device on the main board where the memory is mounted, and the area of the second surface is not limited by the size of the mounting position of the memory chip on the main board. Further, since the test board is provided with the first connection harness for connecting the test area to the first connection area and the second connection harness for connecting the test area to the second connection area, the memory signal of the memory chip can be tested based on the test area, no leads are outside of the test board, and the interference can be relatively small. Therefore, it is unnecessary to add a resistor-capacitor RC matching circuit into the circuit board, and the structure is relatively simple.

The foregoing description is merely specific embodiments of the present disclosure, but the scope of protection of the present disclosure is not limited thereto. Any change or replacement readily contemplated by a person skilled in the art within the technical scope disclosed in the present disclosure shall fall within the scope of protection of the present disclosure. Accordingly, the scope of protection of the present disclosure shall be subject to the scope of protection of the claims.

What is claimed is:

1. A test board for testing a memory signal, comprising a first surface and a second surface,
    wherein the first surface of the test board comprises a raised region and a non raised region; wherein the raised region is provided with a first connection area connectable to a main board, and a level at which the non raised region is located is higher than a level at which the non raised region is located by a preset value;
    wherein the second surface of the test board comprises a test area and a second connection area connectable to a memory chip;
    wherein the test board is provided with a first connection harness for connecting the test area to the first connection area and a second connection harness for connecting the test area to the second connection area, to enable the memory signal of the memory chip to be tested based on the test area.

2. The test board of claim 1, wherein the test area comprises at least two sub-test areas on two sides of the second connection area, the at least two sub-test areas having a same number of test points.

3. The test board of claim 2, wherein the second connection area is a square area, the at least two sub-test areas comprise a first sub-test area and a second sub-test area, and the first sub-test area and the second sub-test area are disposed along two long sides of the second connection area respectively.

4. The test board of claim 1, wherein the test area is provided with test points, a number of the test points of the test area being the same as a number of function pins of the memory chip; wherein the main board comprises a third connection area connectable to the first connection area, the third connection area is provided with first connection points connectable to the function pins of the memory chip, and the first connection area is provided with second connection points at positions for connecting the first connection points; and
    wherein each of first connection lines in the first connection harness is bridged between a respective one of the second connection points and a respective one of the test points corresponding to the respective second connection point.

5. The test board of claim 4, wherein the second connection area is provided with third connection points at positions for connecting the pins of the memory chip; and
    wherein each of second connection lines in the second connection harnesses is bridged between a respective one of the third connection points and a respective one of the test points corresponding to the respective third connection point.

6. The test board of claim 4, wherein two adjacent first connection lines in the first connection harness are insulated from each other; two adjacent second connection lines in the second connection harness are insulated from each other; and the first connection lines have a segment parallel to a segment of the second connection lines.

7. The test board of claim 6, wherein the segment of the first connection lines is equal in length to the segment of the second connection lines.

8. The test board of claim 6, wherein a distance between the segment of the first connection lines and the segment of the second connection lines is greater than or equal to a first distance threshold.

9. The test board of claim 4, wherein the memory chip comprises function pins with different functions; the first connection lines comprise first sub-connection lines corresponding to different functions; and the second connection lines comprise second sub-connection lines corresponding to different functions;
    wherein for each of the functions, a first sub-connection line corresponding to the function is bridged between a second connection point corresponding to the function and a test point corresponding to the function; and wherein for each of the functions, a second sub-connection line corresponding to the function is bridged between a third connection point corresponding to the function and a test point corresponding to the function, to enable a corresponding function signal of the memory chip to be tested based on the test point corresponding to the function.

10. The test board of claim 1, wherein in response to a number of test points provided on the test area being smaller than a number of function pins of the memory chip, the test board is further provided with a third connection harness for connecting the first connection area and the second connection area.

11. The test board of claim 1, wherein the test area comprises at least two sub-test areas, each of the at least two sub-test areas being provided with an array of test points with an equal row spacing and an equal column spacing.

12. The test board of claim 1, wherein the preset value is 2.5 mm.

* * * * *